(12) United States Patent
Cheng et al.

(10) Patent No.: US 8,928,421 B2
(45) Date of Patent: Jan. 6, 2015

(54) CONTROL CIRCUIT FOR REDUCING ELECTROMAGNETIC INTERFERENCE

(71) Applicant: Macroblock, Inc., Hsinchu (TW)

(72) Inventors: Yu-Wen Cheng, Hsinchu (TW); Chung-Ta Tsai, Hsinchu (TW)

(73) Assignee: Macroblock, Inc., Hsinchu (TW)

( * ) Notice: Subject to any disclaimer, the term of this patent is extended or adjusted under 35 U.S.C. 154(b) by 201 days.

(21) Appl. No.: 13/649,929

(22) Filed: Oct. 11, 2012

(65) Prior Publication Data

US 2013/0285757 A1 Oct. 31, 2013

(30) Foreign Application Priority Data

Oct. 12, 2011 (TW) .............................. 100136996 A (51) Int. Cl.
  *H03K 3/02* (2006.01)
  *H03L 7/00* (2006.01)
  *H04B 15/04* (2006.01)
(52) U.S. Cl.
  CPC . *H03L 7/00* (2013.01); *H04B 15/04* (2013.01)
  USPC ......... 331/143; 331/111; 331/177 R; 323/282
(58) Field of Classification Search
  USPC .............. 331/111, 140, 143, 177 R; 332/106, 332/108, 109, 115; 323/268, 280, 281, 282
  See application file for complete search history.

(56) References Cited

U.S. PATENT DOCUMENTS

| | | | |
|---|---|---|---|
| 5,777,501 A * | 7/1998 | AbouSeido | 327/274 |
| 5,859,571 A * | 1/1999 | Lee et al. | 331/53 |
| 5,883,534 A * | 3/1999 | Kondoh et al. | 327/156 |
| 6,107,851 A | 8/2000 | Balakirshnan et al. | |
| 6,211,746 B1 * | 4/2001 | Segawa et al. | 331/143 |
| 6,249,876 B1 | 6/2001 | Balakrishnan et al. | |
| 7,061,780 B2 | 6/2006 | Yang et al. | |
| 7,289,582 B2 | 10/2007 | Jang et al. | |
| 7,911,283 B1 * | 3/2011 | Bergsma et al. | 331/74 |
| 2005/0242892 A1 * | 11/2005 | Ma et al. | 331/143 |
| 2008/0224677 A1 * | 9/2008 | Kim et al. | 323/282 |
| 2009/0201059 A1 * | 8/2009 | Osborne | 327/158 |

* cited by examiner

*Primary Examiner* — Joseph Chang
*Assistant Examiner* — Jeffrey Shin
(74) *Attorney, Agent, or Firm* — Maschoff Brennan (57) ABSTRACT

A control circuit for reducing electromagnetic interference is provided. The control circuit includes a periodic signal generator and a modulation controller. The periodic signal generator adjusts a modulation periodic signal generated by the periodic signal generator, according to a feedback modulation signal. The modulation controller is coupled to the periodic signal generator, for receiving the modulation periodic signal, and adjusting a frequency of the received modulation periodic signal according to a plurality of delay periods set according to a plurality of control signals, and generating the feedback modulation signal.

18 Claims, 7 Drawing Sheets

CONTROL CIRCUIT FOR REDUCING ELECTROMAGNETIC INTERFERENCE

This non-provisional application claims priority under 35 U.S.C. §119(a) on Patent Application No(s). 100136996 filed in Taiwan, R.O.C. on Oct. 12, 2011, the entire contents of which are hereby incorporated by reference.

BACKGROUND

1. Technical Field

The disclosure relates to a circuit that is capable of reducing electromagnetic interference, and more particularly, to a control circuit for reducing electromagnetic interference.

2. Related Art

With advances in digital technology, in order to be able to support the high-density and high-speed information transmission, a reliable and accurate clock generator is required in a digital system to generate a high-frequency clock signal serving as a reference to the transmission rate of data signal. A conventional system clock is generated by a series of functional elements such as chipsets or independently packaged highly integrated IC. However, the ICs are susceptible to the electromagnetic interferences (EMI).

The aforementioned EMI caused by the high-frequency clock signal generated by a clock generator has a negative impact on the reliability and the performance of the digital system. For minimizing such an impact arising out of signal switching at high frequencies, an EMI filter or a snubbing device is disposed at a power input end. However, these additional components increase the manufacturing cost of the entire circuitry.

In order to reduce the energy caused by the high frequency clock signals to reduce the corresponding electromagnetic interference, U.S. Pat. No. 6,249,876 employs a logic manner to output control signals for determining an output current of a digital-to-analog conversion device (D/A converter), and then combines the output current with the current in the oscillator so as to set the frequency of signal variously. However, the current used in the oscillator is usually several micro-amperes ($\mu A$), but the output current of the D/A converter is required to be less than several tens nano-amperes (nA). As a result, the variation in the currents may not be properly controlled, and thus the frequency may not be controlled in a desired fashion.

In addition, U.S. Pat. No. 7,289,582 utilizes an oscillator to output an input reference voltage to a voltage control unit, and by changing the input reference voltage, changes the voltage of an output clock of the oscillator, so as to reduce the electromagnetic interference. However, many resistors connected in series are required to form the multiple input reference voltages (e.g., $2^n$ input reference voltages), and many switches are required to select the output voltage of the voltage control unit. This causes the entire circuit design complicated.

SUMMARY

The disclosure relates to a control circuit for reducing electromagnetic interference, which includes a periodic signal generator and a modulation controller. The periodic signal generator adjusts a modulation periodic signal generated by the periodic signal generator, according to a feedback modulation signal. The modulation controller is coupled to the periodic signal generator to receive the modulation periodic signal, adjust a frequency of the received modulation periodic signal according to a plurality of delay periods set according to a plurality of control signals, and generate the feedback modulation signal.

In an embodiment, the modulation controller includes a control signal generator and a delay unit. The control signal generator receives the feedback modulation signal to generate the control signals according to the received feedback modulation signal. The delay unit is coupled to the control signal generator to receive the modulation periodic signal, and according to the control signal, to set the delay periods to adjust the frequency of the modulation periodic signal, so as to generate the feedback modulation signal.

In an embodiment, the delay unit includes M switches and (M−1) buffers. First ends of the M switches are coupled to each other and receive the modulation periodic signal. A second end of the first switch among the M switches outputs the feedback modulation signal. The first ends of the M switches connect to the second ends of the M switches according to the control signals of n bits, where n is a positive integer greater than one, and $M=2^n$. The ith buffer is coupled to the second end of the (i+1)th switch, and the second ends of the (M−1) buffers are coupled to the second end of the first switch, where i is a positive integer, and 0<i<M. The delay period associated with the ith buffer is shorter than the delay period associated with the (i+1)th buffer.

In another embodiment, the delay unit includes N switches and (N/2) buffers. A first end of the first switch among the N switches receives the modulation periodic signal. A second end of the (N−1)th switch outputs the feedback modulation signal. A second end of the jth switch is coupled to a first end of the (j+2)th switch. A first end of the jth switch is coupled to a first end of the (j+1)th switch. The first ends of the N switches are connected to the second ends of the N switches according to the control signals of n bits, where n is a positive integer greater than 1, $N=2*n$, j is an odd number, and 0<j<N, and. A first end of the kth buffer is coupled to a second end of the (k*2)th switch, a second end of the kth buffer is coupled to a second end of the (K*2−1)th switch, where k is a positive integer, and 0<k<N−1. The delay period associated with the kth buffer is longer than the delay period of the (k+1)th buffer.

In one embodiment, the control signal generator is a random number generator. In another embodiment, the control signal generator is a counter.

In one embodiment, the periodic signal generator includes a switching unit, a capacitor and a pulse generator. A first end of the switching unit receives an operating voltage. A second end of the switching unit is grounded. A control end of the switching unit receives the feedback modulation signal, and according to the feedback modulation signal, controls an output end of the switching unit to selectively form a conducting path with the first end or the second end of the switching unit. A first end of the capacitor is coupled to the output end of the switching unit and provides a capacitor voltage, and a second end of the capacitor is grounded. The pulse generator is coupled to the first end of the capacitor to receive the capacitor voltage and compare the capacitor voltage with at least one reference signal to generate the modulation periodic signal.

In one embodiment, the switching unit includes a current source and a transistor. A first end of the current source serves as the first end of the switching unit. The drain terminal of the transistor is coupled to a second end of the current source and serves as the output end of the switching unit. The gate terminal of the transistor serves as the control end of the switching unit. The source terminal of the transistor serves as the second end of the switching unit.

In one embodiment, the switching unit includes a first current source, a first transistor, a second current source and a second transistor. A first end of the first current source serves as the first end of the switching unit. The source terminal of the first transistor is coupled to a second end of the first current source. The gate terminal of the first transistor serves as the control end of the switching unit. The drain terminal of the first transistor serves as the output end of the switching unit. A first end of the second current source serves as the second end of the switching unit. The source terminal of the second transistor is coupled to a second end of the second current source. The drain terminal of the second transistor is coupled to the drain terminal of the first transistor. The gate terminal of the second transistor is coupled to the gate terminal of the first transistor.

In one embodiment, the pulse generator includes a comparator. A first end of the comparator is coupled to the first end of the capacitor to receive the capacitor voltage. A second end of the comparator receives the reference signal. An output end of the comparator outputs the modulation periodic signal.

In another embodiment, the pulse generator includes a first comparator, a second comparator and a latch. A first end of the first comparator receives a first reference signal. A second end of the first comparator is coupled to the first end of the capacitor to receive the capacitor voltage. An output end of the first comparator outputs a first comparison result. A first end of the second comparator receives a second reference signal. A second end of the second comparator is coupled to the first end of the capacitor to receive the capacitor voltage. An output end of the second comparator outputs a second comparison result. The latch is coupled to the output ends of the first comparator and the second comparator to receive and latch the first comparison result and the second comparison result so as to generate the modulation periodic signal.

With the delay unit for delaying the modulation periodic signal generated by the periodic signal generator, to the disclosure is capable of control when to output the feedback modulation signal, and then adjust the frequency of the modulation periodic signal. Thus, the control circuit in the disclosure may effectively reduce the electromagnetic interference.

BRIEF DESCRIPTION OF THE DRAWINGS

The disclosure will become more fully understood from the detailed description given herein below for illustration only, and thus is not limitative of the disclosure, and wherein.

DETAILED DESCRIPTION

Figure 1:
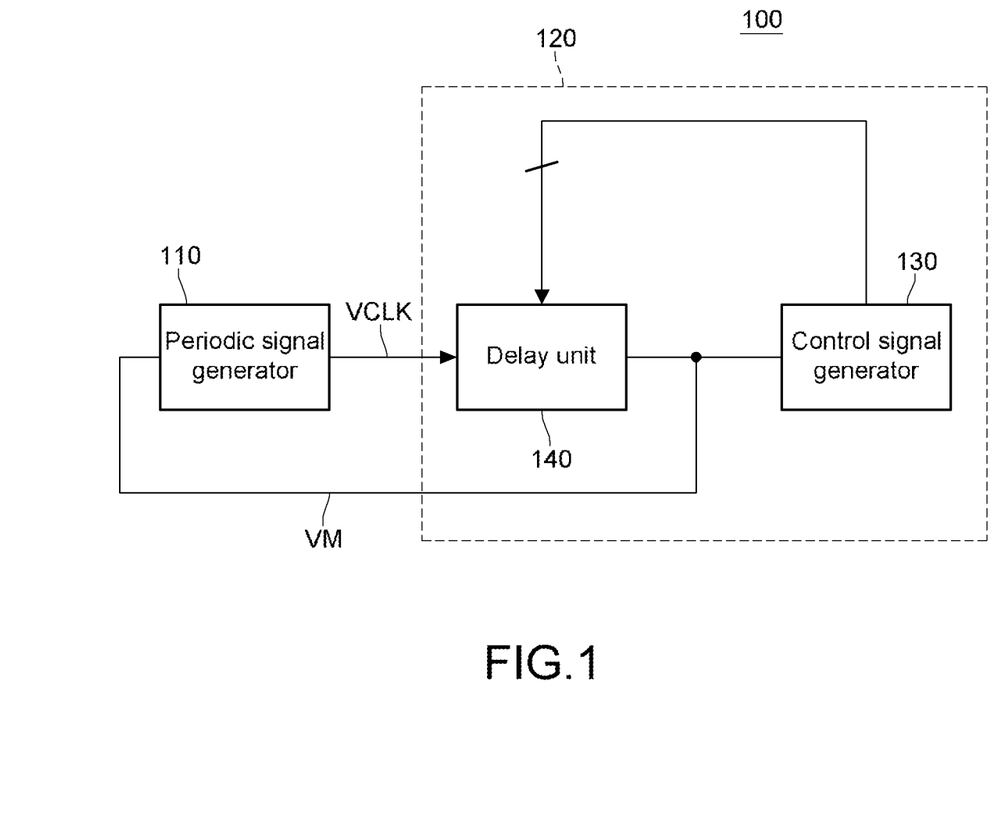
FIG. 1 is a block diagram of a control circuit for reducing electromagnetic interference according to one embodiment of the disclosure.

FIG. 1 is a block diagram of a control circuit for reducing electromagnetic interference according to one embodiment of the disclosure. The control circuit 100 includes a periodic signal generator 110 and a modulation controller 120.

The periodic signal generator 110 adjusts an output signal of the periodic signal generator 110 according to a feedback modulation signal VM, to output a modulation periodic signal VCLK. The modulation controller 120 is coupled to the periodic signal generator 110 for receiving the modulation periodic signal VCLK, and adjusts a frequency of the modulation periodic signal VCLK according to a plurality of delay periods set according to a plurality of control signals, so as to generate a feedback modulation signal VM.

In one embodiment, the modulation controller 120 includes a control signal generator 130 and a delay unit 140. The control signal generator 130 receives the modulation periodic signal VCLK to generate the control signals. The delay unit 140 is coupled to the control signal generator 130, receives the modulation periodic signal VCLK, and according to the aforementioned control signals, sets the different delay periods to modulate the frequency of the modulation periodic signal VCLK, to generate the feedback modulation signal VM. Accordingly, the control circuit 100 may effectively reduce the electromagnetic interference by delaying the output time of the feedback modulation signal VM to adjust the time of generating the modulation periodic signal VCLK, and the frequency of the modulation periodic signal VCLK.

In one embodiment, the control signal generator 130 can be a random number generator. The control signal generator 130 randomly generate the control signals according to the modulation periodic signal VCLK. For example, the control signals include the control signals CS1, CS2, CS3 and CS4, and the control signal generator 130 outputs the control signals in the order of, for example, CS2, CS1, CS4 and CS3. In another embodiment, the control signal generator 130 can be a counter. The control signal generator 130 sequentially generates the aforementioned control signals according to the modulation periodic signal VCLK. For example, the control signals include the control signals CS1, CS2, CS3 and CS4, and the control signal generator 130 outputs the control signals in the order of CS1, CS2, CS3 and CS4.

Figure 2:
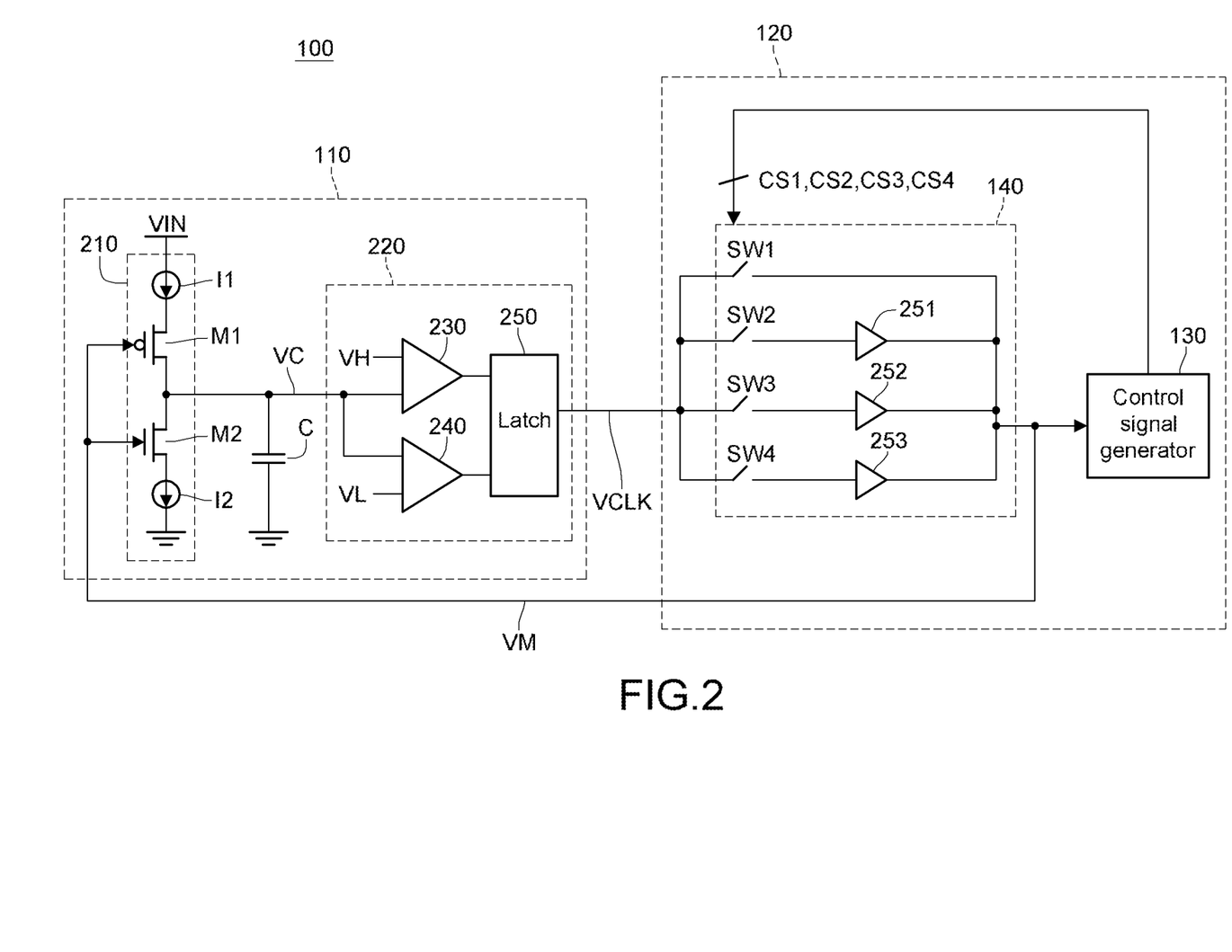
FIG. 2 is a circuit diagram of the control circuit in FIG. 1.

FIG. 2 is a circuit diagram of the control circuit in FIG. 1. The periodic signal generator 110 includes a switching unit 210, a capacitor C and a pulse generator 220. The first end of the switching unit 210 is coupled to an operating voltage VIN. The second end of the switching unit 210 is grounded, and a control end of the switching unit 210 receives the feedback modulation signal VM, and according to the feedback modulation signal VM, controls an output end of the switching unit 210 to selectively form a conducting path with a first end or a second end of the switching unit 210. The first end of the capacitor C is coupled to the output end of the switching unit 210 for providing a capacitor voltage VC. The second end of the capacitor C is grounded. Meanwhile, the pulse generator 220 is coupled to the first end of the capacitor C for receiving the capacitor voltage VC and comparing the capacitor voltage VC with at least one reference signal to generate the modulated periodic signal VCLK.

When the conducting path is formed between the output end and the first end of the switching unit 210, the operating voltage VIN charges the capacitor C through the switching unit 210. On the other hand, when the conducting path is formed between the output end and the second end of the switching unit 210, charges stored in the capacitor C are discharged to the ground.

The switching unit 210 further includes current sources I1 and I2 and transistors M1 and M2. A first end of the current source I1 serves as the first end of the switching unit 210 for receiving the operating voltage VIN. A first end of the current source I2 serves as the second end of the switching unit 210 that is grounded. The current sources I1 and I2 can be, for example, constant current sources.

The source terminal of the transistor M1 is coupled to the first end of the current source I1, the gate terminal of the transistor M1 serves as the control terminal of the switching unit 210 for receiving the feedback modulation signal VM, and the drain terminal of the transistor M1 serves as the output end of the switching unit 210. The source terminal of the transistor M2 is coupled to a second end of the current source I2, the drain terminal of the transistor M2 is coupled to the drain terminal of the transistor M1, and the gate terminal of the transistor M2 is coupled to the gate terminal of the transistor M1. The transistor M1 can be, for example, a p-type transistor, and the transistor M2 can be, for example, an N-type transistor.

The pulse generator 220 also includes comparators 230 and 240 and a latch 250. A first end of the comparator 230 receives a first reference signal VH, a second end of the comparator 230 is coupled to the first end of the capacitor C to receive the capacitor voltage VC, and an output end of the comparator 230 generates a first comparison result. A first end of the comparator 240 receives a second reference signal VL, a second end of the comparator 240 is coupled to the first end of the capacitor C to acquire the capacitor voltage VC, and an output end of the comparator 240 outputs a second comparison result. The latch 250 is coupled to the comparators 230 and 240, for receiving and latching the first comparison result and the second comparison result, to generate the modulation periodic signal VCLK.

The delay unit 140 includes M switches and (M−1) buffers. First ends of the M switches are coupled to each other and receive the modulation periodic signal VCLK. A second end of the first switch among the M switches outputs the feedback modulation signal VM, and the first ends of the M switches respectively connect to the second ends of the M switches according to the control signals of n bits, where n is a positive integer greater than one, and $M=2^n$. The ith buffer is coupled to the second end of the (i+1)th switch, the second end of the (M−1)th buffer is coupled to the second end of the first switch, where i is a positive integer, and 0<i<M. The delay period associated with the ith buffer is shorter than the delay period associated with the (i+1)th buffer.

For an explanation purpose, an example is taken that n=2 and M=4 (square of 2). In this embodiment, the control signals are binary signals including the control signals CS1 (00), CS2 (01), CS3 (10) and CS4 (11), the M switches include the switches SW1 to SW4, and the buffers include the buffers 251 to 253.

The first end of the switch SW1 (the first switch among the four switches) receives the modulated periodic signal VCLK. The second end of the switch SW1 presents the feedback modulation signal VM. The first end of the switch SW1 connects to the second end of the switch SW1 according to the control signal CS1. The first end of the switch SW2 (the second switch) is coupled to the first end of the switch SW1, and the first end and the second end of the switch SW2 connect to each other according to the control signal CS2. The first end of the switch SW3 (the third switch) is coupled to the first end of the switch SW1, and the first and second ends of the switch SW3 connect to or do not connect to each other according to the control signal CS3. The first end of the switch SW4 (the fourth switch) is coupled to the first end of the switch SW1, and the first and second ends of the switch SW4 connect to each other according to the control signal CS4.

The first end of the buffer 251 is coupled to the second end of the switch SW2, the second end of the buffer 251 is coupled to the second end of the switch SW1. The first end of the buffer 252 is coupled to the second end of the switch SW3, and the second end of the buffer 252 is coupled to the second end of the buffer 251. The first end of the buffer 253 is coupled to the second end of the switch SW4, and the second end of the buffer 253 is coupled to the second end of the buffer 252.

The delay periods associated with the buffers 251 to 253 are in an ascending order. For example, the delay period associated with the buffer 251 is 1T, the delay period associated with the buffer 252 is 2T, and the delay period associated with the buffer 253 is 3T.

When the control circuit 100 starts to operate, the feedback modulation signal VM generated by the modulation controller 120 is at a low logic level, and is outputted to the gate terminals of the transistors M1 and M2. Herein, the transistor M1 is turned on and the transistor M2 is turned off. The operating voltage VIN charges the capacitor C through the current source I1, so that the capacitor voltage VC is increased. When the level of the capacitor voltage VC reaches the level of a first reference signal VH, the pulse generator 220 generates the modulation periodic signal VCLK of a high logic level, and output the modulation periodic signal VCLK to the delay unit 140.

Upon the receipt of the modulation periodic signal VCLK, the delay unit 140 delays the modulation periodic signal VCLK to change the frequency of the modulation periodic signal VCLK to generate the feedback modulation signal VM, and then outputs the feedback modulation signal VM to the gate terminals of the transistors M1 and M2. Thus, the transistor M1 is turned off, and the transistor M2 is turned on. The charges stored in the capacitor C are discharged to the ground through the current source I2, and the capacitor voltage VC is reduced. When the capacitor voltage VC drops to the level of the second reference signal VL, the pulse generator 220 generates the modulation periodic signal VCLK of a low logic level, and outputs the modulation periodic signal VCLK to the delay unit 140. The delay unit 140 receives and delays the modulation periodic signal VCLK of a low logic level to generate the feedback modulation signal VM of a low logic level, and then outputs the feedback modulation signal VM to the gate terminals of the transistors M1 and M2.

Since the control signals CS1, CS2, CS3 and CS4 can sequentially or randomly adjust their states, the delay unit 140 is capable of selecting a first path (the switch SW1), a second path (the switch SW2 and the buffer 251), a third path (the switch SW3 and the buffer 252) or a fourth path (the switch SW4 and the buffer 253), to set the various delay periods for adjusting the frequency of the modulation periodic signal VCLK, so as to generate the feedback modulation signal VM. By adjusting the frequency of the modulation periodic signal VCLK, the electromagnetic interference may be reduced.

Figure 3:
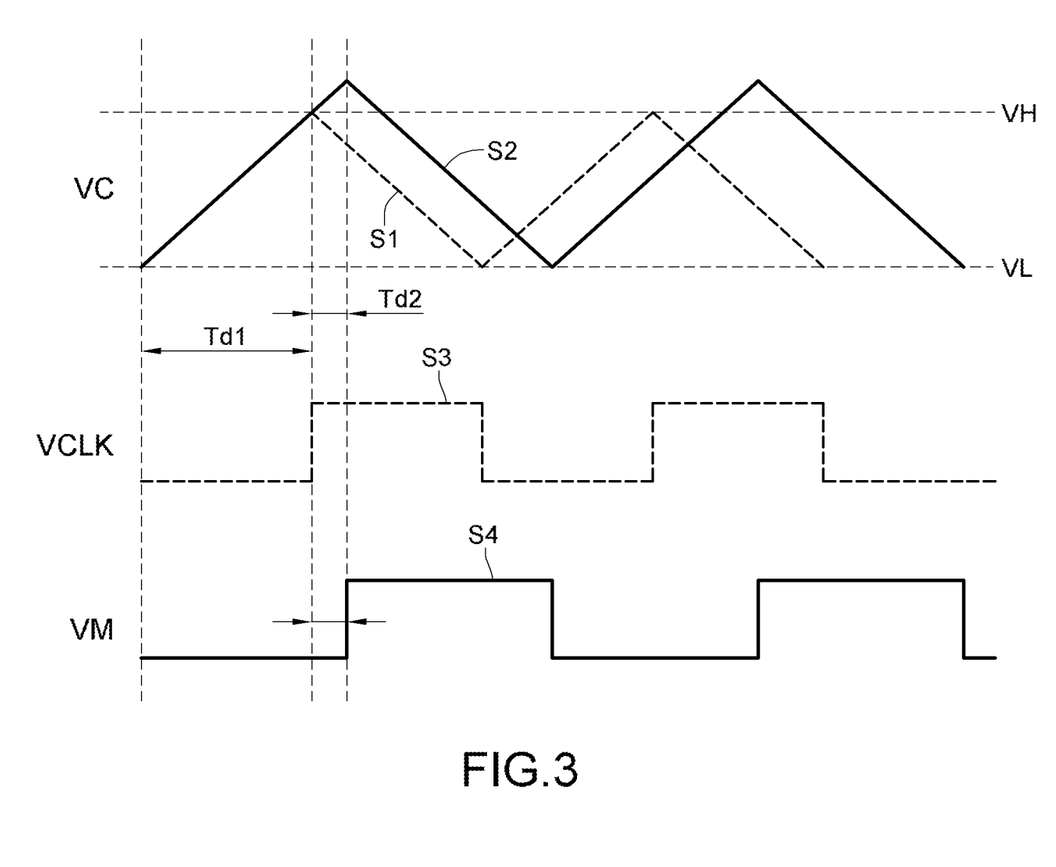
FIG. 3 is waveform diagram of the capacitor voltage, the modulation periodic signal and the feedback modulation signal according to the disclosure.

FIG. 3 is a waveform diagram of the capacitor voltage, the modulation periodic signal and the feedback modulation signal according to one embodiment of the disclosure. A curve S1 (shown by a broken line) represents the waveform of the capacitor voltage VC caused by the non-delayed modulation periodic signal VCLK. A curve S2 (shown by a solid line) represents the waveform of the capacitor voltage VC caused by the delayed modulation periodic signal VCLK. A curve S3 (shown by a broken line) represents the waveform of the modulation periodic signal VCLK. A curve S4 (shown by a solid line) represents the waveform of the feedback modulation signal VM (generated by the delayed modulation periodic signal VCLK). VH represents to the first reference signal. VL represents the second reference signal. Td1 represents the transition time of the non-delayed modulation periodic signal VCLK transitions. Td2 represents the delay period of the feedback modulation signal VM which is generated by delaying the modulation periodic signal VCLK through the delay unit.

In view of FIG. 3, when the level of the curve S1 (i.e., the capacitor voltage VC) rises to the level of the first reference signal VH, the modulation periodic signal VCLK generated by the periodic signal generator 110 transforms from a low logic level to a high logic level as shown in the curve S3. Herein, the modulation periodic signal VCLK of a high logic level without delaying is outputted to the gate terminals of the transistor M1 and M2 directly. Therefore, the transistor M1 is turned off, and the transistor M2 is turned on, so that the capacitor voltage VC is reduced as shown in the curve S1.

When the level of the curve S1 drops to the level of the second reference signal VL, the modulation periodic signal VCLK generated by the periodic signal generator 110 transforms from a high logic level to a low logic level as shown in the curve S3. Herein, the modulation periodic signal VCLK of a high logic level without delaying is outputted directly to the gate terminals of the transistors M1 and M2. Therefore, the transistor M1 is turned on, and the transistor M2 is turned off, so that the capacitor voltage VC drops as shown in the curve S1.

On the other hand, when the level of the curve S2 rises to the level of the first reference signal VH in the transition time Td1, the modulation periodic signal VCLK generated by the periodic signal generator 110 transforms from a low logic level to a high logic level. Since the modulation periodic signal VCLK is delayed by the delay unit 140, the feedback modulation signal VM transforms from a low logic level to a high logic level later than the modulation periodic signal VCLK by the delay period Td2 as shown in the curve S3. In other words, the curve S2 (or the capacitor voltage VC) continuously rises after the transition time Td1 until the feedback modulation signal VM transforms from the low logic level to the high logic level, and then drops. The delay period Td2 is set on the basis of the delay period of each of the buffers. That is, the longer the delay period associated with the buffer, the longer the delay period Td2 is. Contrariwise, the shorter the delay period associated with the buffer, the shorter the delay period Td2 is.

Figure 4:
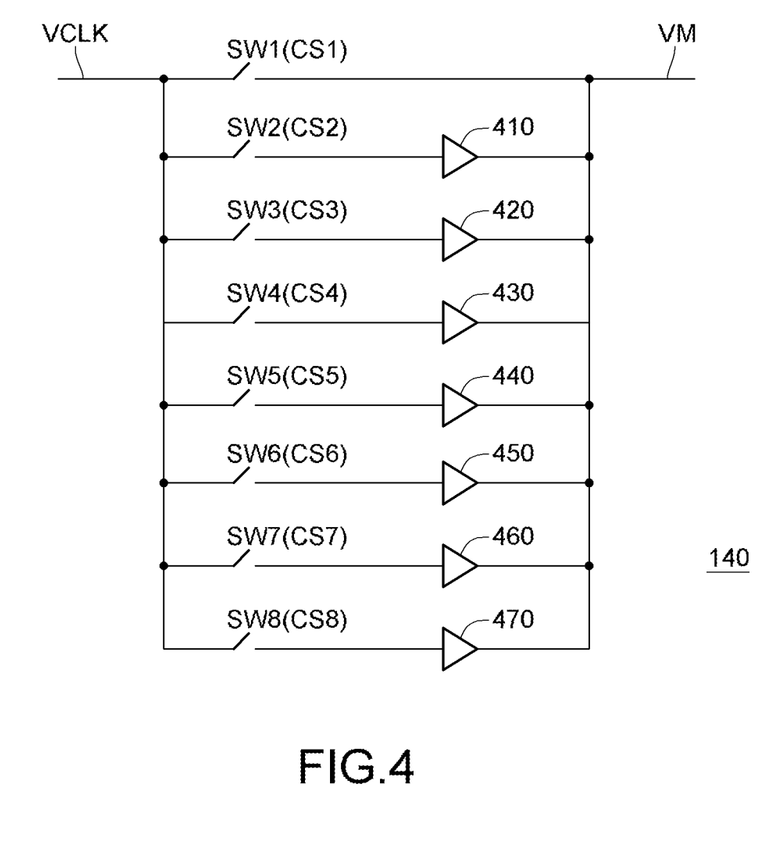
FIG. 4 is a circuit diagram of another embodiment of the delay unit in FIG. 2.

FIG. 4 is a circuit diagram of another embodiment of the delay unit in FIG. 2. In this embodiment, n=3, and M=$2^3$=8. That is, the control signals are three-bits signals and include the control signals CS1 (000), CS2, (001), CS3 (010), CS4 (011), CS5 (100), CS6 (101), CS7 (011) and CS8 (111), the switches include the switches SW1 to SW8, and the buffers include the buffers 410 to 470.

The first end of the switch SW1 (the first switch) receives the modulation periodic signal VCLK, and the second end of the switch SW1 generates the feedback modulation signal VM. The first end and the second end of the switch SW1 connect to each other according to the control signal CS1. The first end of the switch SW2 (the second switch) is coupled to the first end of the switch SW1, and the first end and the second end of the switch SW2 connect to each other according to the control signal CS2. The first end of the switch SW3 is coupled to the first end of the switch SW1, and the first end and the second end of the switch SW3 connect to each other according to the control signal CS3. The first end of the switch SW4 is coupled to the first end of the switch SW1, and the first end of the second end of the switch SW4 connect to each other according to the control signal CS4.

The first end of the switch SW5 is coupled to the first end of the switch SW1, and the first end and the second end of the switch SW5 connect to each other according to the control signal CS5. The first end of the switch SW6 is coupled to the first end of the switch SW1, and the first end and the second end of the switch SW6 connect to each other according to the control signal CS6. The first end of the switch SW7 is coupled to the first end of the switch SW1, and the first end and the second end of the switch SW7 connect to each other according to the control signal CS7. The first end of the switch SW8 is coupled to the first end of the switch SW1, and the first end and the second end of the switch SW8 connect to each other according to the control signal CS8.

The first end of the buffer 410 is coupled to the second end of the switch SW2, and the second end of the buffer 410 is coupled to the second end of the switch SW1. The first end of the buffer 420 is coupled to the second end of the switch SW3, and the second end of the buffer 420 is coupled to the second end of the buffer 410. The first end of the buffer 430 is coupled to the second end of the switch SW4, and the second end of the buffer 430 is coupled to the second end of the buffer 420. The first end of the buffer 440 is coupled to the second end of the switch SW5, and the second end of the buffer 440 is coupled to the second end of the buffer 430. The first end of the buffer 450 is coupled to the second end of the switch SW6, and the second end of the buffer 450 is coupled to the second end of the buffer 440. The first end of the buffer 460 is coupled to the second end of the switch SW7, and the second end of the buffer 460 is coupled to the second end of the buffer 450. The first end of the buffer 470 is coupled to the second end of the switch SW8, and the second end of the buffer 470 is coupled to the second end of the buffer 460.

The delay periods associated with the buffers 410 to 470 are in the ascending order. For example, the delay period associated with the buffer 410 is 1T, the delay period associated with the buffer 420 is 2T, the delay period associated with the buffer 430 is 3T, the delay period associated with the buffer 440 is 4T, the delay period associated with the buffer 450 is 5T, the delay period associated with the buffer 460 is 6T, and the delay period associated with the buffer 470 is 7T.

The control signals CS1 to CS8 can change their states sequentially or randomly. Consequently, the delay unit 140 is allowed to select the first path (the switch SW1), the second path (the switch SW2 and the buffer 410), the third path (the switch SW3 and the buffer 420), the fourth path (the switch SW4 and the buffer 430), the fifth path (the switch SW5 and the buffer 440), the sixth path (the switch SW6 and the buffer 450), the seventh path (the switch SW7 and the buffer 460) or the path (the switch SW8 and the buffer 470), to set various delay periods to adjust the frequency of the modulation periodic signal VCLK, so as to generate the feedback modulation signal VM.

It is worth noting that FIGS. 2 and 4 are directed to implementation examples of the delay unit 140. In other words, the delay unit 140 can be implemented differently.

Figure 5:
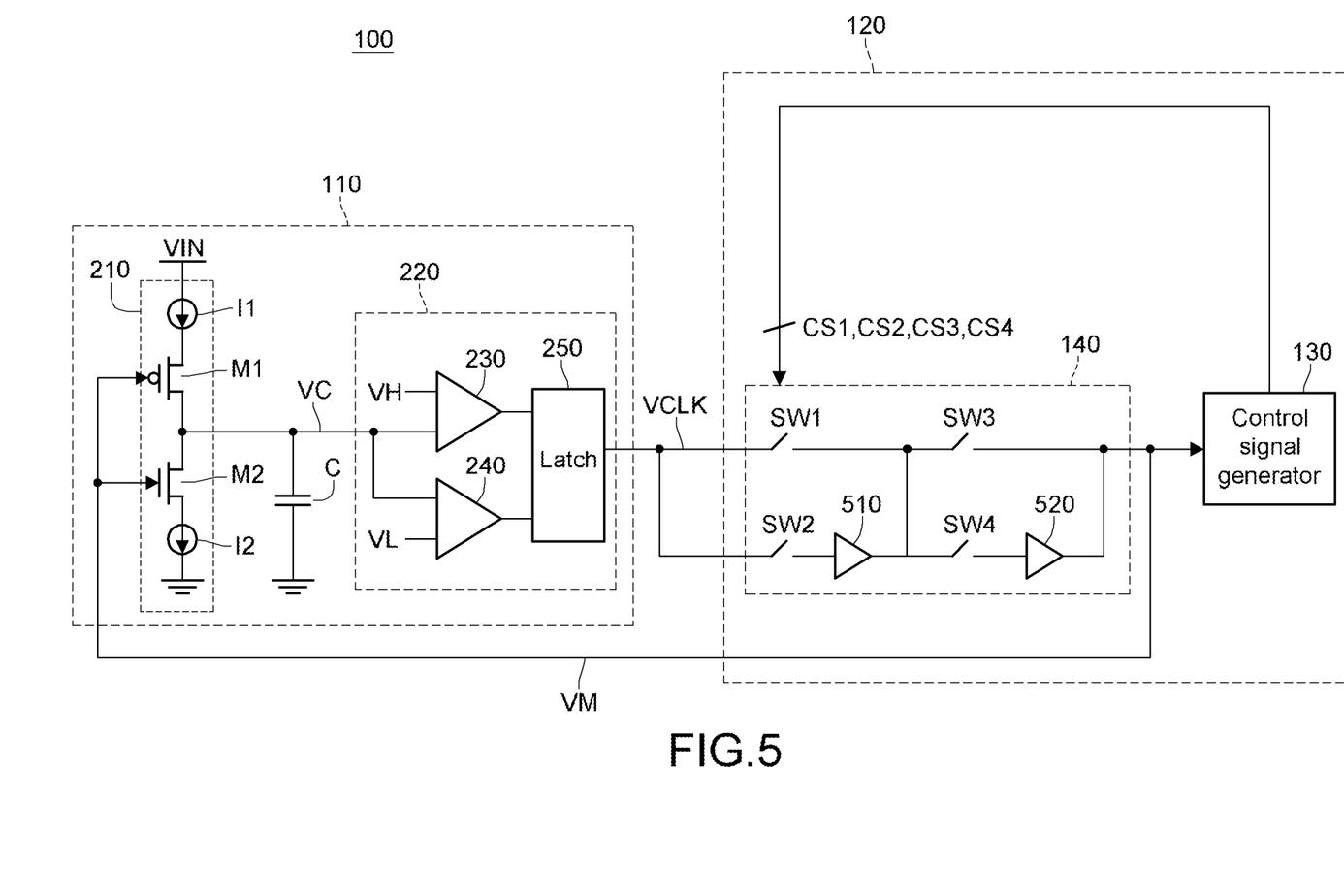
FIG. 5 is a circuit diagram of the control circuit according to one embodiment of the disclosure.

FIG. 5 is a circuit diagram of the control circuit according to one embodiment of the disclosure. The connectional relationship of the components in the periodic signal generator 110 and the operation of the control signal generator 130 have already disclosed in the description associated with FIG. 2.

The delay unit 140 includes N switches and (N−2) buffers. The first end of the first switch receives the modulation periodic signal VCLK. The second end of the (N−1)th switch among the N switches outputs the feedback modulation signal VM. The second end of the jth switch is coupled to the first end of the (J+2)th switch, and the first end of the jth switch is coupled to the first end of the (j+1)th switch. The first end and the second end of each of the N switches connect to each other according to the n-bit control signal, where n is a positive integer larger than 1, N=2*n, j is an odd number, and 0<j<N. The first end of the kth buffer is coupled to the second end of the (k*2)th switch, and the second end of the kth buffer is coupled to the second end of the ((k*2)−1)th switch, where k is a positive integer greater than zero but smaller than (N−1). The delay period associated with the kth buffer is less than the delay period associated with the (k+1)th buffer.

For example, n=2, and N=2*2=4. Herein, the control signals are binary signals and include the control signals CS1 to CS6, the number of the switches is 4, for example, the switches SW1 to SW4, and the number of the buffers is 2, for example the buffers 510 to 520.

The first end of the switch SW1 (the first switch) receives the modulation periodic signal VCLK. The first end and the second end of the switch SW1 connect to each other according to the control signal CS1. The first end of the switch SW3 (the third switch) is coupled to the second end of the switch SW1, the second end of the switch SW3 outputs the feedback modulation signal VM, and the first end and the second end of the third switch SW3 connect to each other according to the control signal CS3. The first end of the switch SW2 (the second switch) is coupled to the first end of the switch SW1, and the first end and the second end of the switch SW2 connect to each other according to the control signal CS2. The first end of the switch SW4 is coupled to the first end of the switch SW3, and the first end and the second end of the switch SW4 connect to each other according to the control signal CS4.

The buffer 510, as the first buffer, has the first end coupled to the second end of the switch SW2, and has the second end coupled to the second end of the switch SW1. The buffer 520, as the second buffer, has the first end coupled to the second end of the switch SW4, and has the second end coupled to the second end of the switch SW3.

The delay periods associated with the buffers 510 and 520 are in a decreasing order. For example, the delay period associated with the buffer 510 is 2T, and the delay period associated with the buffer 520 is T. The control signals CS1 and CS2 are complementary to each other. While the control signals CS1 and CS3 are at a high logic level, the control signals CS2 and CS4 are at a low logic level respectively. Conversely, while the control signals CS1 and CS3 are at a high logic level, the control signals CS2 and CS4 are at a low logic level. With this arrangement, the control signals CS1 to CS4 are represented in terms of the binary signals as (00), (01), (10) and (11), for turning on or off the switches SW1 to SW4.

The states of the control signals CS1 to CS4 are adjusted sequentially or randomly, so that the delay unit 140 is allowed to select the first path (the switches SW1 and SW3), the second path (the switches SW1 and SW4 and the buffer 520), the third path (the switch SW2, the buffer 510 and the switch SW3) or the fourth path (the switch SW2, the buffer 510, the switch SW4 and the buffer 520), to set various delay periods for delaying the modulation periodic signal VCLK, so as to control when to output the feedback modulation signal VM and then adjust the frequency of the modulation periodic signal VCLK. Accordingly, the electromagnetic interference may be reduced.

Figure 6:
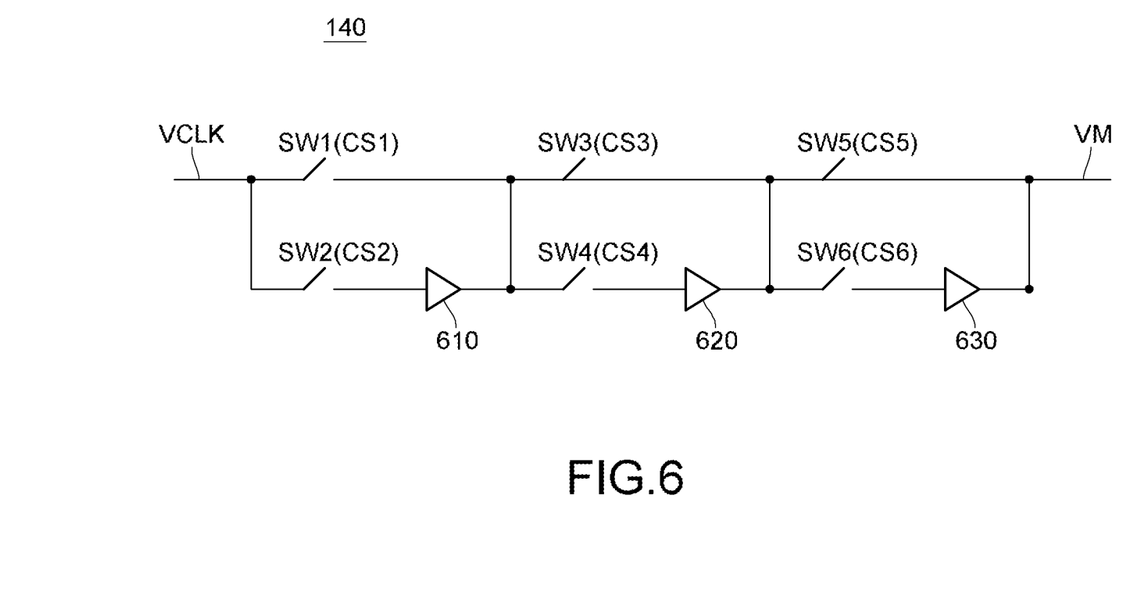
FIG. 6 is a circuit diagram of another embodiment of the delay unit in FIG. 5.

FIG. 6 is a circuit diagram of another embodiment of the delay unit in FIG. 5. In this embodiment, n=3, and N=2*3=6. Herein, the control signals are 3-bit signals and include the control signals CS1 to CS6, the number of the switches is 6, for example, the switches SW1 to SW6, and the number of the buffers is 3, for example, the buffers 610 to 630.

The first end of the switch SW1 (the first switch) receives the modulation periodic signal VCLK, the first end and the second end of the switch SW1 connect to each other according to the control signal CS1. The first end of the switch SW3 (the third switch) is coupled to the second end of the switch SW1, and the first end and the second end of the switch SW3 are controlled whether to connect to each other according to the control signal CS3. The first end of the switch SW5 (the fifth switch) is coupled to the second end of the switch SW3, and the first end and the second end of the SW5 are controlled whether to connect to each other according to the control signal CS5.

The first end of the switch SW2 (the second switch) is coupled to the first end of the switch SW1, and the first end and the second end of the switch SW2 are controlled whether to connect to each other according to the control signal CS2. The first end of the switch SW4 (the fourth switch) is coupled to the first end of the switch SW3, and the first end and the second end of the switch SW4 connect to each other according to the control signal CS4. The first end of the switch SW6 (the sixth switch) is coupled to the first end of the switch SW5, and the first end and the second end of the switch SW6 connect to each other according to the control signal CS6.

The first end of the buffer 610 (the first buffer) is coupled to the second end of the switch SW2, and the second end of the buffer 610 is coupled to the second end of the switch SW1. The first end of the buffer 620 (the second buffer) is coupled to the second end of the switch SW4, and the second end of the buffer 620 is coupled to the second end of the switch SW3. The first end of the buffer 630 (the third buffer) is coupled to the second end of the switch SW6, and the second end of the buffer 630 is coupled to the second end of the switch SW5.

The delay periods associated with the buffers 610, 620 and 630 are in a decreasing order. For example, the delay period associated with the buffer 610 is 4T, the delay period associated with the buffer 620 is 2T, and the delay period associated with the buffer 630 is 1T. The control signals CS1 and CS2 are complementary to each other the control signals CS3 and CS4 are complementary to each other, and the control signals CS5 and CS6 are complementary to each other. In other words, when the control signals CS1, CS3 and CS5 are at a high logic level, the control signals CS2, CS4 and CS6 are at a low logic level. Conversely, when the control signals CS1, CS3 and CS5 are at a high logic level, the control signals CS2, CS4 and CS6 are at a low logic level. With this arrangement, the control signals CS1 to CS6 are represented in terms of the 3-bit signals as (000), (001), (010), (011), (100), (101), (110) and (111), for turning on or off the switches SW1 to SW6.

The states of the control signals CS1 to CS6 are adjusted sequentially or randomly, so that the delay unit 140 is allowed to select the first path (the switches SW1, SW3 and SW5), the second path (the switches SW1, SW3 and SW6 and the buffer 630), the third path (the switches SW1 and SW4, the buffer 620 and the switch SW5), the fourth path (the switches SW1 and SW4, the buffer 620, the switch SW6 and the buffer 630), the fifth path (the switches SW2, the buffer 610 and the switches SW3 and SW5), the sixth path (the switch SW2, the buffer 610, the switches SW3 and SW6 and the buffer 630), the seventh path (the switch SW2, the buffer 610, the switch SW4, the buffer 620 and the switch SW5), or the eighth path (the switch SW2, the buffer 610, the switch SW4, the buffer 620, the switch SW6, and the buffer 630), to set various delay periods to delay the modulation periodic signal VCLK to control when to output the feedback modulation signal VM, so as to adjust the frequency of the modulation periodic signal VCLK.

It is worth noting that FIGS. 5 and 6 are directed to implementation examples of the delay unit 140. In other words, the delay unit 140 can be implemented differently.

Figure 7:
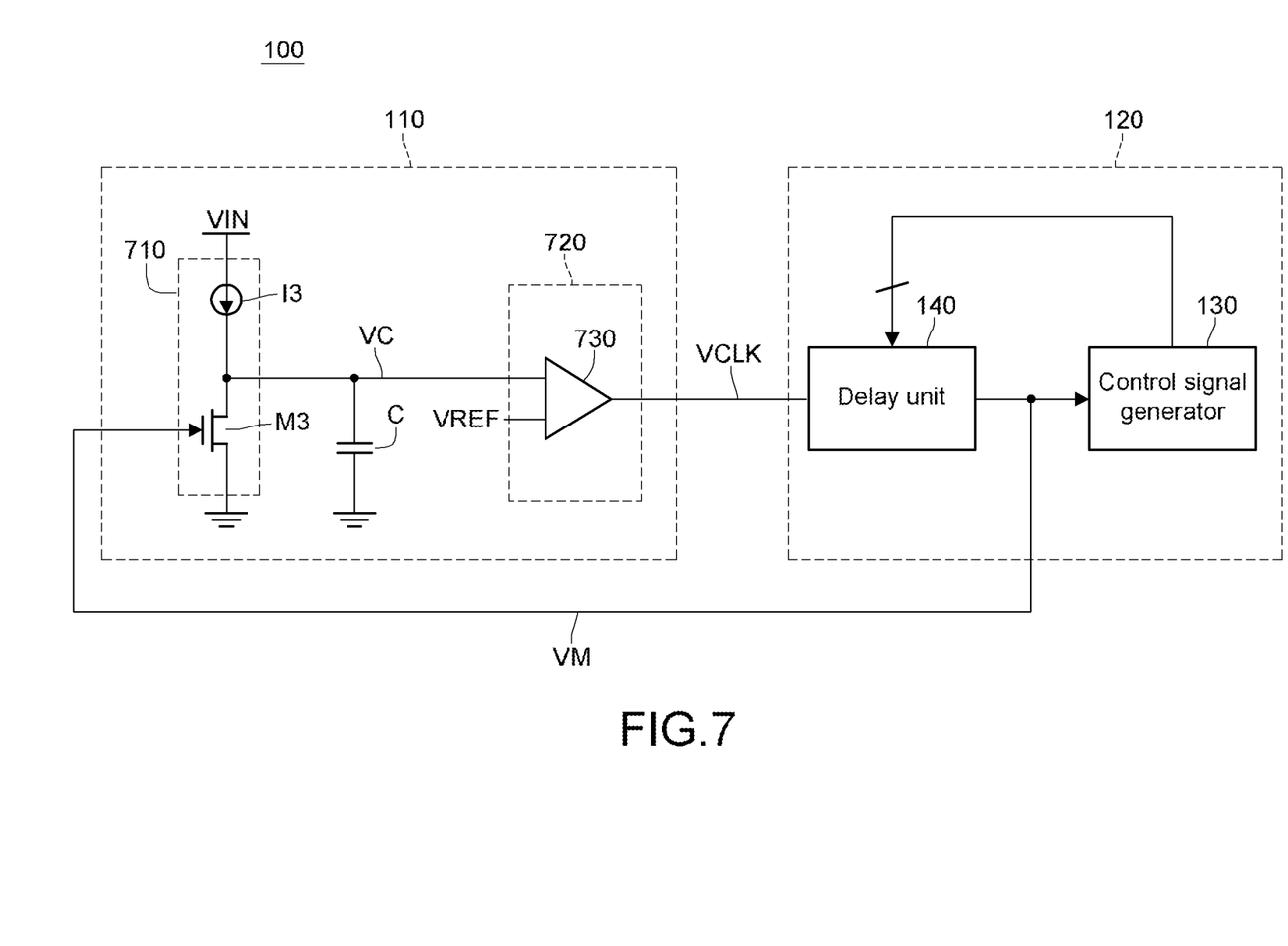
FIG. 7 is a circuit diagram of the control unit according to one embodiment of the disclosure.

FIG. 7 is a circuit diagram of the control unit according to one embodiment of the disclosure. In this embodiment, the connectional relationship and operation of the components in the modulation controller 120 are referred to the description in FIGS. 2 and 5.

The periodic signal generator 110 includes a switching unit 710, a capacitor C and a pulse generator 720. The first end of the switching unit 710 receives the operating voltage VIN, the second end of the switching unit 710 is grounded, and the control end of the switching unit 710 receives the feedback modulation signal VM, so that according to the received feedback modulation signal VM, the output end of the switching unit 710 to selectively form the conducting path with the first end or the second end of the switching unit 710. The first end of the capacitor C is coupled to the output end of the switching unit 710 for providing the capacitor voltage VC, and the second end of the capacitor C is grounded. The pulse generator 720 is coupled to the first end of the capacitor C to receive the capacitor voltage VC and to compare the received capacitor voltage VC with at least one reference signal to generate the modulation periodic signal VCLK.

In the embodiment, when the output end and the first end of the switching unit 710 form the conducting path, the operating voltage VIN charges the capacitor C through the switching unit 710. On the other hand, when the output end and the second end of the switching unit 710 form the conducting path, the capacitor C is grounded through the switching unit 710, and the charges stored in the capacitor C are discharged to the ground.

The switching unit 710 includes a current source 13 and a transistor M3. The first end of the current source 13 serves as the first end of the switching unit 710 for receiving the operating voltage VIN. The current source 13 is, for example, a constant current source.

The drain terminal of the transistor M3 is coupled to the first end of the current source 13, and serves as the output end of the switching unit 710. The gate terminal of the transistor M3 serves as the control end of the switching unit 710, for receiving the feedback modulation signal VM. The source terminal of the transistor M3 serves as the second end of the switching unit 710 and is grounded. The transistor M3 is, for example, an N-type transistor.

The pulse generator 720 includes a comparator 730. The first end of the comparator 730 is coupled to the first end of the capacitor C, for receiving the capacitor voltage VC. The second end of the comparator 730 receives the reference signal VREF, and the output end of the comparator 730 outputs the modulation periodic signal VCLK.

The present disclosure provides a control circuit for reducing the electromagnetic interference, which uses the delay unit in the modulation controller to delay the modulation periodic signal generated by the periodic signal generator to adjust the output time of the feedback modulation signal, thereby adjusting the frequency of the modulation periodic signal. Thus, the electromagnetic interference may be effectively reduced.

What is claimed is:

1. A control circuit for reducing electromagnetic interference, comprising:
   a periodic signal generator, for adjusting a modulation periodic signal generated by the periodic signal generator, according to a feedback modulation signal; and
   a modulation controller, coupled to the periodic signal generator, for receiving the modulation periodic signal, and adjusting a frequency of the received modulation periodic signal according to a plurality of delay periods set according to a plurality of control signals, to generate the feedback modulation signal, the modulation controller comprising:
   a control signal generator for receiving the feedback modulation signal and generating the control signals according to the received feedback modulation signal; and
   a delay unit coupled to the control signal generator, for receiving the modulation periodic signal, and according to the control signals, setting the delay periods used to adjust the frequency of the modulation periodic signal to generate the feedback modulation signal, the delay unit comprising:
   M switches, a first end and a second end of each of the M switches connecting to each other according to the corresponding control signal of n bits, the first ends of the M switches being coupled to each other and receiving the modulation periodic signal, the second end of the first switch outputting the feedback modulation signal, and, where n is a positive integer greater than one, and M=2$^n$; and
   M−1 buffers, the ith buffer coupled to the second end of the (i+1)th switch, second end of the M−1 buffers coupled to the second end of the first switch, where i is a positive integer, and 0<i<M, wherein the delay periods associated with the ith buffer is less than the delay period associated with the (i+)th buffer.

2. The control circuit according to claim 1, wherein the periodic signal generator comprises:
   a switching unit, a first end of the switching unit receiving an operating voltage, a second end of the switching unit grounded, and a control end of the switching unit receiving the feedback modulation signal, and an output end of the switching unit selectively forming a conducting path with the first end or the second end of the switching unit according to the feedback modulation signal;
   a capacitor, a first end of the capacitor coupled to the output end of the switching unit and providing a capacitor voltage, and a second end of the capacitor grounded; and
   a pulse generator, coupled to the first end of the capacitor, for receiving the capacitor voltage and comparing the capacitor voltage with at least one reference signal to generate the modulation periodic signal.

3. The control circuit according to claim 2, wherein the switching unit comprises:
   a current source, a first end of the current source serving as the first end of the switching unit; and
   a transistor, the drain terminal of the transistor coupled to a second end of the current source and serving as the output end of the switching unit, the gate terminal of the transistor serving as the control end of the switching unit, and the source terminal of the transistor serving as the second end of the switching unit.

4. The control circuit according to claim 2, wherein the switching unit comprises:
   a first current source having a first end serving as the first end of the switching unit;
   a first transistor, the source terminal of the first transistor coupled to a second end of the first current source, the gate terminal of the first transistor serving as the control end of the switching unit, and the drain terminal of the first transistor serving as the output end of the switching unit;
   a second current source having a first end serving as the second end of the switching unit; and
   a second transistor, the source terminal of the second transistor coupled to a second end of the second current source, the drain terminal of the second transistor coupled to the drain terminal of the first transistor, and the gate terminal of the second transistor coupled to the gate terminal of the first transistor.

5. The control circuit according to claim 2, wherein the pulse generator comprises:
- a comparator, a first end of the comparator coupled to the first end of the capacitor to receive the capacitor voltage, a second end of the comparator receiving the reference signal, and an output end of the comparator outputting the modulation periodic signal.

6. The control circuit according to claim 2, wherein the pulse generator comprises:
- a first comparator, a first end of the first comparator receiving a first reference signal, a second end of the first comparator coupled to the first end of the capacitor to receive the capacitor voltage, and an output end of the first comparator outputting a first comparison result;
- a second comparator, a first end of the second comparator receiving a second reference signal, a second end of the second comparator coupled to the first end of the capacitor to receive the capacitor voltage, and an output end of the second comparator outputting a second comparison result; and
- a latch, coupled to the output ends of the first comparator and the second comparator to receive and latch the first comparison result and the second comparison result, so as to generate the modulation periodic signal.

7. A control circuit for reducing electromagnetic interference, comprising:
- a periodic signal generator for adjusting a modulation periodic signal generated by the periodic signal generator according to a feedback modulation signal; and
- a modulation controller coupled to the periodic signal generator, for receiving the modulation periodic signal and adjusting a frequency of the received modulation periodic signal according to a plurality of delay periods set according to a plurality of control signals to generate the feedback modulation signal, wherein the modulation controller comprises:
  - a control signal generator for receiving the feedback modulation signal and generating the control signals according to the received feedback modulation signal; and
  - a delay unit coupled to the control signal generator, for receiving the modulation periodic signal and, according to the control signals, setting the delay periods used to adjust the frequency of the modulation periodic signal to generate the feedback modulation signal, wherein the delay unit further comprises:
    - N switches, a first end and a second end of each of the N switches connecting to each other according to the corresponding control signal of n bits, the first end of the first switch of the N switches receiving the modulation periodic signal, the second end of the (N−1)th switch outputting the feedback modulation signal, the second end of the jth switch coupled to the first end of the (j+2)th switch, the first end of the jth switch coupled to the first end of the (j+1)th switch, where n is a positive integer greater than 1, N=2*n, j is an odd number, and 0<j<N; and
    - (N/2) buffers, a first end of the kth buffer coupled to a second end of the (k*2)th switch, a second end of the kth buffer coupled to a second end of the (K*2−1)th switch, where k is a positive integer, and 0<k<N−1, wherein the delay period associated with the kth buffer is greater than the delay period of the (k+1)th buffer.

8. The control circuit according to claim 7, wherein the periodic signal generator comprises:
- a switching unit, a first end of the switching unit receiving an operating voltage, a second end of the switching unit being grounded, a control end of the switching unit receiving the feedback modulation signal, and an output end of the switching unit selectively forming a conducting path with the first end or the second end of the switching unit according to the feedback modulation signal;
- a capacitor, wherein a first end of the capacitor is coupled to the output end of the switching unit and providing a capacitor voltage, and a second end of the capacitor is grounded; and
- a pulse generator coupled to the first end of the capacitor, for receiving the capacitor voltage and comparing the capacitor voltage with at least one reference signal to generate the modulation periodic signal.

9. The control circuit according to claim 8, wherein the switching unit comprises:
- a current source, wherein a first end of the current source serves as the first end of the switching unit; and
- a transistor, wherein a drain terminal of the transistor is coupled to a second end of the current source and serves as the output end of the switching unit, a gate terminal of the transistor serving as the control end of the switching unit, and a source terminal of the transistor serving as the second end of the switching unit.

10. The control circuit according to claim 8, wherein the switching unit comprises:
- a first current source having a first end serving as the first end of the switching unit;
- a first transistor, wherein a source terminal of the first transistor is coupled to a second end of the first current source, a gate terminal of the first transistor serving as the control end of the switching unit, and a drain terminal of the first transistor serving as the output end of the switching unit;
- a second current source having a first end serving as the second end of the switching unit; and
- a second transistor, wherein a source terminal of the second transistor is coupled to a second end of the second current source, a drain terminal of the second transistor is coupled to the drain terminal of the first transistor, and a gate terminal of the second transistor coupled to the gate terminal of the first transistor.

11. The control circuit according to claim 8, wherein the pulse generator comprises:
- a comparator, wherein a first end of the comparator is coupled to the first end of the capacitor to receive the capacitor voltage, a second end of the comparator receiving the reference signal, and an output end of the comparator outputting the modulation periodic signal.

12. The control circuit according to claim 8, wherein the pulse generator comprises:
- a first comparator, wherein a first end of the first comparator receives a first reference signal, a second end of the first comparator is coupled to the first end of the capacitor to receive the capacitor voltage, and an output end of the first comparator outputs a first comparison result;
- a second comparator, wherein a first end of the second comparator receives a second reference signal, a second end of the second comparator is coupled to the first end of the capacitor to receive the capacitor voltage, and an output end of the second comparator outputs a second comparison result; and
- a latch coupled to the output ends of the first comparator and the second comparator to receive and latch the first comparison result and the second comparison result, so as to generate the modulation periodic signal.

13. A control circuit for reducing electromagnetic interference, comprising:
- a periodic signal generator for adjusting a modulation periodic signal generated by the periodic signal generator according to a feedback modulation signal; and
- a modulation controller coupled to the periodic signal generator for receiving the modulation periodic signal and adjusting a frequency of the received modulation periodic signal according to a plurality of delay periods set according to a plurality of control signals to generate the feedback modulation signal, wherein the modulation controller comprises:
  - a control signal generator for receiving the feedback modulation signal to generate the control signals according to the received feedback modulation signal, wherein the control signal generator is a random number generator; and
  - a delay unit coupled to the control signal generator for receiving the modulation periodic signal, and according to the control signals, setting the delay periods used to adjust the frequency of the modulation periodic signal to generate the feedback modulation signal.

14. The control circuit according to claim 13, wherein the periodic signal generator comprises:
- a switching unit, wherein a first end of the switching unit receives an operating voltage, a second end of the switching unit is grounded, and a control end of the switching unit receives the feedback modulation signal, and an output end of the switching unit selectively forms a conducting path with the first end or the second end of the switching unit according to the feedback modulation signal;
- a capacitor, wherein a first end of the capacitor is coupled to the output end of the switching unit and provides a capacitor voltage, and a second end of the capacitor is grounded; and
- a pulse generator, coupled to the first end of the capacitor, for receiving the capacitor voltage and comparing the capacitor voltage with at least one reference signal to generate the modulation periodic signal.

15. The control circuit according to claim 14, wherein the switching unit comprises:
- a current source, wherein a first end of the current source serves as the first end of the switching unit; and
- a transistor, wherein a drain terminal of the transistor is coupled to a second end of the current source and serves as the output end of the switching unit, a gate terminal of the transistor serves as the control end of the switching unit, and a source terminal of the transistor serves as the second end of the switching unit.

16. The control circuit according to claim 14, wherein the switching unit comprises:
- a first current source having a first end serving as the first end of the switching unit;
- a first transistor, a source terminal of the first transistor being coupled to a second end of the first current source, a gate terminal of the first transistor serving as the control end of the switching unit, and a drain terminal of the first transistor serving as the output end of the switching unit;
- a second current source having a first end serving as the second end of the switching unit; and
- a second transistor, wherein a source terminal of the second transistor is coupled to a second end of the second current source, a drain terminal of the second transistor is coupled to the drain terminal of the first transistor, and a gate terminal of the second transistor coupled to the gate terminal of the first transistor.

17. The control circuit according to claim 14, wherein the pulse generator comprises:
- a comparator, wherein a first end of the comparator is coupled to the first end of the capacitor to receive the capacitor voltage, a second end of the comparator receiving the reference signal, and an output end of the comparator outputting the modulation periodic signal.

18. The control circuit according to claim 14, wherein the pulse generator comprises:
- a first comparator, wherein a first end of the first comparator receives a first reference signal, a second end of the first comparator is coupled to the first end of the capacitor to receive the capacitor voltage, and an output end of the first comparator outputs a first comparison result;
- a second comparator, wherein a first end of the second comparator receives a second reference signal, a second end of the second comparator is coupled to the first end of the capacitor to receive the capacitor voltage, and an output end of the second comparator outputs a second comparison result; and
- a latch coupled to the output ends of the first comparator and the second comparator to receive and latch the first comparison result and the second comparison result, so as to generate the modulation periodic signal.

* * * * *